(12) United States Patent
Hu

(10) Patent No.: US 9,685,390 B2
(45) Date of Patent: Jun. 20, 2017

(54) MICROELECTRONIC PACKAGE HAVING NON-COPLANAR, ENCAPSULATED MICROELECTRONIC DEVICES AND A BUMPLESS BUILD-UP LAYER

(75) Inventor: Chuan Hu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/994,521

(22) PCT Filed: Jun. 8, 2012

(86) PCT No.: PCT/US2012/041714
§ 371 (c)(1),
(2), (4) Date: Nov. 4, 2013

(87) PCT Pub. No.: WO2013/184145
PCT Pub. Date: Dec. 12, 2013

(65) Prior Publication Data
US 2014/0048959 A1     Feb. 20, 2014

(51) Int. Cl.
*H01L 23/00*       (2006.01)
*H01L 23/29*       (2006.01)
(Continued)

(52) U.S. Cl.
CPC ......... *H01L 23/298* (2013.01); *H01L 21/561* (2013.01); *H01L 21/568* (2013.01);
(Continued)

(58) Field of Classification Search
None
See application file for complete search history.

(56) References Cited

U.S. PATENT DOCUMENTS 4,921,160 A * 5/1990 Flynn et al. ................. 235/492
5,353,498 A    10/1994 Fillion et al.
(Continued)

FOREIGN PATENT DOCUMENTS

JP       2012-074536 A   4/2012
KR   10-2010-0038232 A   4/2010
(Continued)

OTHER PUBLICATIONS

Ma, "Direct Build-Up Layer on an Encapsulated Die Package", U.S. Appl. No. 09/640,961, filed Aug. 16, 2000, 70 pages.
(Continued)

*Primary Examiner* — Johannes P Mondt
(74) *Attorney, Agent, or Firm* — Winkle, PLLC

(57) ABSTRACT

A microelectronic package having an encapsulated substrate comprising a plurality of microelectronic devices encapsulated within an encapsulation material, wherein the encapsulated structure may have an active surface proximate the active surfaces of the plurality of microelectronic devices, and wherein at least one of the plurality of microelectronic devices may have a height greater than another of the plurality of microelectronic devices (e.g. non-coplanar). The microelectronic package further includes a bumpless build-up layer structure formed proximate the encapsulated structure active surface. The microelectronic package may also have an active surface microelectronic device positioned proximate the encapsulated structure active surface and in electrical contact with at least one of the plurality of microelectronic devices of the encapsulated substrate.

7 Claims, 9 Drawing Sheets

(51) Int. Cl.
   *H01L 23/31*       (2006.01)
   *H01L 21/56*       (2006.01)
   *H01L 23/538*      (2006.01)

(52) U.S. Cl.
   CPC ...... *H01L 23/3107* (2013.01); *H01L 23/5389* (2013.01); *H01L 24/03* (2013.01); *H01L 24/24* (2013.01); *H01L 24/82* (2013.01); *H01L 24/96* (2013.01); *H01L 24/97* (2013.01); *H01L 23/295* (2013.01); *H01L 24/73* (2013.01); *H01L 2224/0401* (2013.01); *H01L 2224/04105* (2013.01); *H01L 2224/12105* (2013.01); *H01L 2224/16145* (2013.01); *H01L 2224/24137* (2013.01); *H01L 2224/24145* (2013.01); *H01L 2224/32145* (2013.01); *H01L 2224/48091* (2013.01); *H01L 2224/48137* (2013.01); *H01L 2224/48145* (2013.01); *H01L 2224/73265* (2013.01); *H01L 2224/73267* (2013.01); *H01L 2224/82031* (2013.01); *H01L 2224/82039* (2013.01); *H01L 2224/92244* (2013.01); *H01L 2224/97* (2013.01); *H01L 2924/00014* (2013.01); *H01L 2924/12042* (2013.01)

(56) References Cited

U.S. PATENT DOCUMENTS

| | | | |
|---|---|---|---|
| 5,497,033 A | 3/1996 | Fillion et al. | |
| 5,510,649 A | 4/1996 | Adhihetty et al. | |
| 5,527,741 A | 6/1996 | Cole et al. | |
| 5,841,193 A | 11/1998 | Eichelberger | |
| 6,154,366 A | 11/2000 | Ma et al. | |
| 6,159,767 A | 12/2000 | Eichelberger | |
| 6,239,482 B1 | 5/2001 | Fillion et al. | |
| 6,242,282 B1 | 6/2001 | Fillion et al. | |
| 6,271,469 B1 | 8/2001 | Ma et al. | |
| 6,306,680 B1 | 10/2001 | Fillion et al. | |
| 6,396,148 B1 | 5/2002 | Eichelberger et al. | |
| 6,396,153 B2 | 5/2002 | Fillion et al. | |
| 6,423,570 B1 | 7/2002 | Ma et al. | |
| 6,426,545 B1 | 7/2002 | Eichelberger et al. | |
| 6,472,762 B1 | 10/2002 | Kutlu | |
| 6,489,185 B1 | 12/2002 | Towle et al. | |
| 6,507,122 B2* | 1/2003 | Blackshear | 257/787 |
| 6,555,906 B2 | 4/2003 | Towle et al. | |
| 6,555,908 B1 | 4/2003 | Eichelberger et al. | |
| 6,580,611 B1 | 6/2003 | Vandentop et al. | |
| 6,586,276 B2 | 7/2003 | Towle et al. | |
| 6,586,822 B1 | 7/2003 | Vu et al. | |
| 6,586,836 B1 | 7/2003 | Ma et al. | |
| 6,617,682 B1 | 9/2003 | Ma et al. | |
| 6,703,400 B2 | 3/2004 | Johnson et al. | |
| 6,706,553 B2 | 3/2004 | Towle et al. | |
| 6,709,898 B1 | 3/2004 | Ma et al. | |
| 6,713,859 B1 | 3/2004 | Ma | |
| 6,734,534 B1 | 5/2004 | Vu et al. | |
| 6,794,223 B2 | 9/2004 | Ma et al. | |
| 6,818,544 B2 | 11/2004 | Eichelberger et al. | |
| 6,825,063 B2 | 11/2004 | Vu et al. | |
| 6,841,413 B2 | 1/2005 | Liu et al. | |
| 6,888,240 B2 | 5/2005 | Towle et al. | |
| 6,894,399 B2 | 5/2005 | Vu et al. | |
| 6,902,950 B2 | 6/2005 | Ma et al. | |
| 6,964,889 B2 | 11/2005 | Ma et al. | |
| 7,067,356 B2 | 6/2006 | Towle et al. | |
| 7,071,024 B2 | 7/2006 | Towle et al. | |
| 7,078,788 B2 | 7/2006 | Vu et al. | |
| 7,109,055 B2 | 9/2006 | McDonald et al. | |
| 7,112,467 B2 | 9/2006 | Eichelberger et al. | |
| 7,144,756 B1 | 12/2006 | Wang et al. | |
| 7,160,755 B2 | 1/2007 | Lo et al. | |
| 7,183,658 B2 | 2/2007 | Towle et al. | |
| 7,189,596 B1 | 3/2007 | Mu et al. | |
| 7,416,918 B2 | 8/2008 | Ma | |
| 7,420,273 B2 | 9/2008 | Liu et al. | |
| 7,425,464 B2 | 9/2008 | Fay et al. | |
| 7,442,581 B2 | 10/2008 | Lytle et al. | |
| 7,459,782 B1 | 12/2008 | Li | |
| 7,476,563 B2 | 1/2009 | Mangrum et al. | |
| 7,588,951 B2 | 9/2009 | Mangrum et al. | |
| 7,595,226 B2 | 9/2009 | Lytle et al. | |
| 7,619,901 B2 | 11/2009 | Eichelberger et al. | |
| 7,632,715 B2 | 12/2009 | Hess et al. | |
| 7,648,858 B2 | 1/2010 | Tang et al. | |
| 7,651,889 B2 | 1/2010 | Tang et al. | |
| 7,655,502 B2 | 2/2010 | Mangrum et al. | |
| 7,659,143 B2 | 2/2010 | Tang et al. | |
| 7,723,164 B2 | 5/2010 | Lu et al. | |
| 7,851,905 B2 | 12/2010 | Chrysler et al. | |
| 8,035,216 B2 | 10/2011 | Skeete | |
| 8,093,704 B2 | 1/2012 | Palmer et al. | |
| 8,105,934 B2 | 1/2012 | Kwon et al. | |
| 8,264,849 B2 | 9/2012 | Guzek | |
| 8,304,913 B2 | 11/2012 | Nalla et al. | |
| 8,319,318 B2 | 11/2012 | Nalla et al. | |
| 8,497,587 B2 | 7/2013 | Ma | |
| 8,535,989 B2 | 9/2013 | Sankman et al. | |
| 8,969,140 B2 | 3/2015 | Sankman et al. | |
| 2001/0002051 A1* | 5/2001 | Matsumoto | H01L 23/053 257/177 |
| 2001/0015492 A1 | 8/2001 | Akram et al. | |
| 2002/0063342 A1 | 5/2002 | Blackshear | |
| 2002/0088116 A1 | 7/2002 | Milkovich et al. | |
| 2003/0207495 A1 | 11/2003 | Akram | |
| 2004/0262776 A1* | 12/2004 | Lebonheur et al. | 257/778 |
| 2005/0112798 A1* | 5/2005 | Bjorbell | H01L 23/5385 438/106 |
| 2006/0091560 A1 | 5/2006 | Kang et al. | |
| 2006/0145328 A1 | 7/2006 | Hsu | |
| 2006/0151865 A1 | 7/2006 | Han et al. | |
| 2006/0186536 A1 | 8/2006 | Hsu | |
| 2008/0029895 A1 | 2/2008 | Hu et al. | |
| 2008/0128916 A1 | 6/2008 | Soejima et al. | |
| 2008/0182363 A1* | 7/2008 | Amrine | H01L 21/561 438/118 |
| 2008/0315377 A1 | 12/2008 | Eichelberger et al. | |
| 2008/0315391 A1 | 12/2008 | Kohl et al. | |
| 2008/0315398 A1 | 12/2008 | Lo et al. | |
| 2009/0072382 A1 | 3/2009 | Guzek | |
| 2009/0075428 A1 | 3/2009 | Tang et al. | |
| 2009/0079064 A1 | 3/2009 | Tang et al. | |
| 2009/0121347 A1 | 5/2009 | Kasai et al. | |
| 2009/0152743 A1 | 6/2009 | Jomaa et al. | |
| 2009/0212416 A1 | 8/2009 | Skeete | |
| 2009/0236031 A1* | 9/2009 | Sunohara et al. | 156/182 |
| 2010/0013101 A1 | 1/2010 | Hedler et al. | |
| 2010/0044855 A1 | 2/2010 | Eichelberger et al. | |
| 2010/0047970 A1 | 2/2010 | Eichelberger et al. | |
| 2010/0073894 A1 | 3/2010 | Mortensen et al. | |
| 2010/0127394 A1 | 5/2010 | Ramiah et al. | |
| 2011/0089546 A1 | 4/2011 | Bayan | |
| 2011/0101491 A1 | 5/2011 | Skeete et al. | |
| 2011/0108999 A1* | 5/2011 | Nalla et al. | 257/784 |
| 2011/0121449 A1 | 5/2011 | Lin et al. | |
| 2011/0156231 A1 | 6/2011 | Guzek | |
| 2011/0156235 A1 | 6/2011 | Yuan | |
| 2011/0156261 A1 | 6/2011 | Kapusta et al. | |
| 2011/0215464 A1 | 9/2011 | Guzek | |
| 2011/0221069 A1 | 9/2011 | Kunimoto | |
| 2011/0228464 A1 | 9/2011 | Guzek et al. | |
| 2011/0241186 A1 | 10/2011 | Nalla et al. | |
| 2011/0241195 A1 | 10/2011 | Nalla et al. | |
| 2011/0254124 A1 | 10/2011 | Nalla et al. | |
| 2011/0281375 A1 | 11/2011 | Swaminathan et al. | |
| 2011/0316140 A1 | 12/2011 | Nalla et al. | |
| 2012/0001339 A1 | 1/2012 | Malatkar | |
| 2012/0005887 A1 | 1/2012 | Mortensen et al. | |
| 2012/0009738 A1 | 1/2012 | Crawford et al. | |
| 2012/0074580 A1* | 3/2012 | Nalla | H01L 21/568 257/774 |
| 2012/0074581 A1 | 3/2012 | Guzek et al. | |
| 2012/0112336 A1 | 5/2012 | Guzek et al. | |
| 2012/0139095 A1 | 6/2012 | Manusharow et al. | |

(56) References Cited

U.S. PATENT DOCUMENTS

2012/0139116 A1 6/2012 Manusharow et al.
2012/0326271 A1 12/2012 Teh et al.
2013/0003319 A1 1/2013 Malatkar et al.

FOREIGN PATENT DOCUMENTS

| KR | 10-2010-0105506 A | 9/2010 |
|---|---|---|
| WO | 2013/003257 A2 | 1/2013 |
| WO | 2013/003695 A2 | 1/2013 |
| WO | 2013/003257 A3 | 3/2013 |
| WO | 2013/003695 A3 | 5/2013 |
| WO | 2013/184145 A1 | 12/2013 |

OTHER PUBLICATIONS

International Search Report and Written Opinion received for PCT Application No. PCT/US2012/037787, mailed on Jul. 26, 2013, 10 pages.

Office Action received for Taiwan Patent Application No. 101119764, mailed on Dec. 20, 2012, 2 pages of Taiwan Office Action only.

International Preliminary Report on Patentability and Written Opinion received for PCT Patent Application No. PCT/US2012/041714, mailed on Dec. 18, 2014, 7 pages.

International Search Report and Written Opinion received for PCT Patent Application No. PCT/US2012/041714, mailed on Feb. 26, 2013, 10 pages.

International Search Report and Written Opinion received for PCT Patent Application No. PCT/US2012/043945, mailed on Jan. 10, 2013, 12 pages.

International Search Report and Written Opinion received for PCT Patent Application No. PCT/US2012/044871, mailed on Jan. 10, 2013, 10 pages.

Office Action received for German Patent Application No. 112012006469.0, mailed on Aug. 5, 2016, 6 pages of German Office Action.

* cited by examiner

MICROELECTRONIC PACKAGE HAVING NON-COPLANAR, ENCAPSULATED MICROELECTRONIC DEVICES AND A BUMPLESS BUILD-UP LAYER

TECHNICAL FIELD

Embodiments of the present description generally relate to the field of microelectronic packages and, more particularly, to a microelectronic package having a plurality of non-coplanar, encapsulated microelectronic devices and a bumpless build-up layer.

BACKGROUND ART

The microelectronic industry is continually striving to produced ever faster and smaller microelectronic packages for use in various mobile electronic products, such as portable computers, electronic tablets, cellular phones, digital cameras, and the like. Typically, a microelectronic package must have a significant number of conductive routes (for the routing of power/ground and input/output signals) between a microelectronic device, such a microprocessor, a chipset, a graphics device, a wireless device, a Memory device, an application specific integrated circuit, or the like, and external interconnects used to connect the microelectronic package to external components, such as motherboards, interposers, printed circuit boards, and the like. The formation of the significant number of conductive routes may necessitate the formation in a relatively large microelectronic device, may require stringent design rules, and/or may require numerous layers of dielectric material and conductive traces within an interconnection layer to achieve a proper conductive routing to the external interconnects. Furthermore, multiple microelectronic device may be used in the fabrication of a microelectronic packages which may result in issues including, but not limited to, bandwidth limitation between the interconnection of the multiple microelectronic devices, reliability of the package when ball grid array attachment structures are utilized, scaling of the microelectronic package, form factor issues with multiple package attached to a single microelectronic substrate or motherboard, cost issues with integrating multiple devices each with its own package, and potential conductive trace "fan out" limitations, as will be understood to those skilled in the art.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF THE EMBODIMENTS

Figure 1:
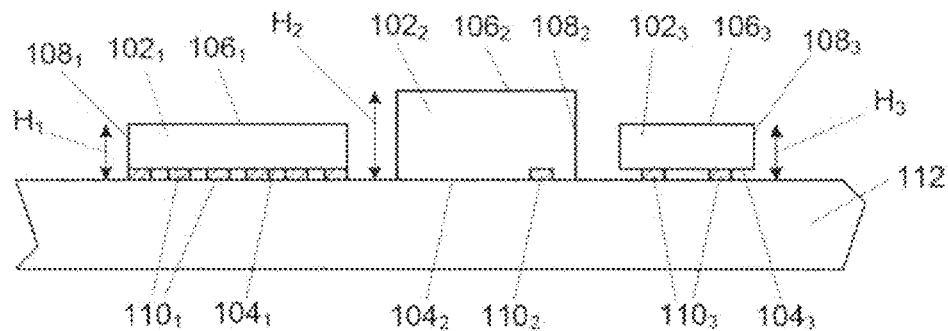
FIG. 1 illustrates a side cross-sectional view of a plurality of microelectronic devices positioned on a carrier substrate, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description may include a microelectronic package having an encapsulated substrate comprising a plurality of microelectronic devices substantially encapsulated within an encapsulation material, wherein the encapsulated structure may have an active surface proximate the active surfaces of the plurality of microelectronic devices, and wherein at least one of the plurality of microelectronic devices may have a height greater than another of the plurality of microelectronic devices (e.g. non-coplanar). The microelectronic package further includes a bumpless build-up layer structure formed proximate the encapsulated structure active surface. The microelectronic package may also have an active surface microelectronic device positioned proximate the encapsulated structure active surface and in electrical contact with at least one of the plurality of microelectronic devices of the encapsulated substrate.

In one embodiment of the present description, a plurality of microelectronic devices (illustrated as elements $102_1$-$102_3$), such as microprocessors, chipsets, controller, a graphics device, a wireless device, a memory device, an application specific integrated circuits, resistors, capacitors, inductors, or the like, may be placed on a carrier substrate 112, as shown in FIG. 1. The microelectronic devices $102_1$-$102_3$ may be placed on the carrier substrate 112 with their respective active surfaces $104_1$-$104_3$ abutting and/or proximate the carrier substrate 112. As further illustrated in FIG. 1, the microelectronic device active surfaces $104_1$-$104_3$ may each have at least one connection structure $110_1$-$110_3$, such as a bond pad, a solder bump or pillar, bond post, and the like, thereon. It is noted the heights, i.e. distance from the microelectronic device active surface (see element $104_2$) or connection structures (see elements $110_1$ and $110_1$) projecting from the microelectronic device (e.g. microelectronic device $102_1$ and $102_3$, respectively) to each respective back surface $106_1$-$106_3$ (illustrated as $H_1$-$H_3$) of each respective microelectronic device $102_1$-$102_3$ need not be substantially equal.

Figure 2:
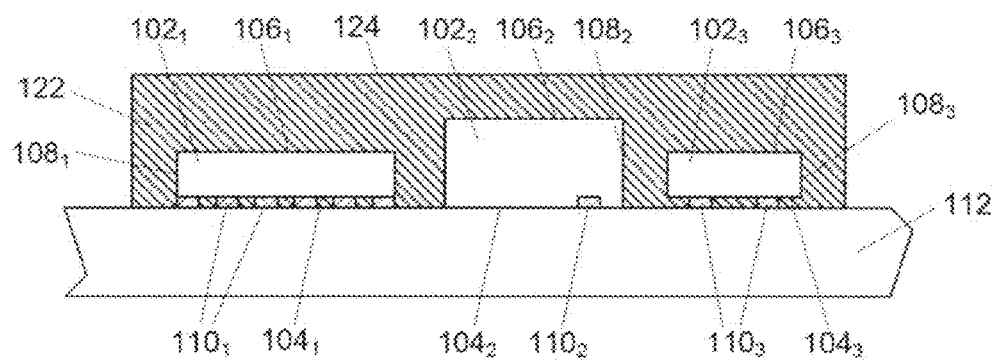
FIG. 2 illustrates a side cross-sectional view of an encapsulation material disposed on the microelectronic devices of FIG. 1, according to an embodiment of the present description.
Figure 3:
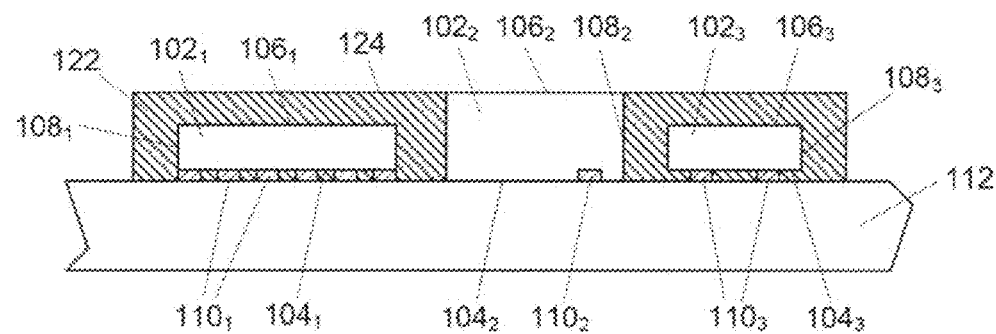
FIG. 3 illustrates a side cross-sectional view of an encapsulation material disposed on the microelectronic devices of FIG. 1, according to another embodiment of the present description.

As shown in FIGS. 2 and 3, an encapsulation material 122 may be disposed over each microelectronic device $102_1$-$102_3$ and the carrier substrate 112. The encapsulation material 122 may be disposed by any appropriate technique, including but not limited to material deposition and molding. The encapsulation material 122 may be any appropriate material, including but not limited to a silica-filled epoxy, such as materials available from Ajinomoto Fine-Techno Co., Inc., 1-2 Suzuki-cho, Kawasaki-ku, Kawasaki-shi, 210-0801, Japan (e.g. Ajinomoto ABF-GX13, Ajinomoto GX92, and the like). As shown in FIG. 2, the encapsulation material 122 may form a back surface 124 covering each of the microelectronic devices $102_1$-$102_3$, wherein the encapsulation material 122 abuts each microelectronic device back surface $106_1$-$106_3$ and abuts at least one side $108_1$-$108_3$ (extending between each respective microelectronic device active surface $104_1$-$104_3$ and each respective microelectronic device back surface $106_1$-$106_3$) of each respective microelectronic device $102_1$-$102_3$. Alternately, as shown in FIG. 3, the encapsulation material back surface 124 may be formed to be substantially planar to the back surface of the microelectronic device having the greatest height (illustrated as microelectronic device $102_2$ with height $H_2$ (see FIG. 1)). This may be achieved with molding. This may also be achieved by planarizing (such as chemical mechanical polishing) the structure shown in FIG. 2.

Figure 4:
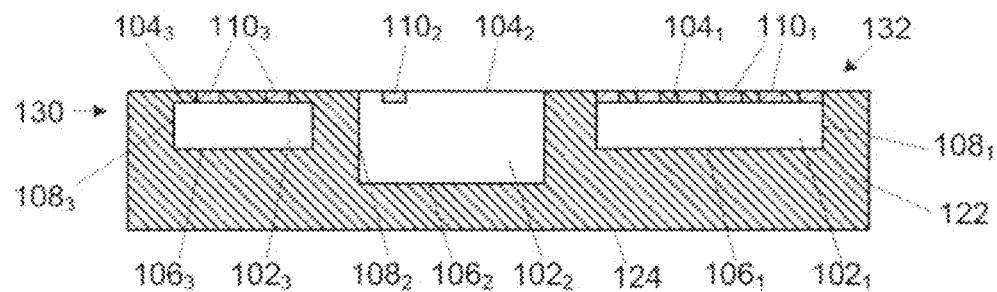
FIG. 4 illustrates a side cross-sectional view of an encapsulated structure formed by the curing/solidifying the encapsulation material and removal of the encapsulated structure from the carrier substrate, according to an embodiment of the present description.
Figure 5:
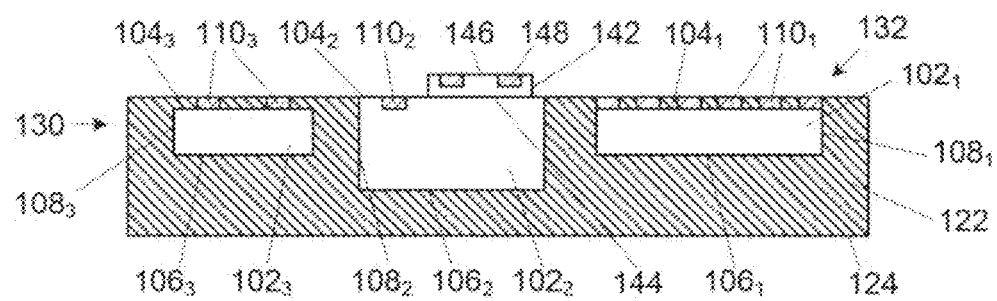
FIG. 5 illustrates an active surface microelectronic device positioned on an active surface of the encapsulated structure, according to an embodiment of the present description.
Figure 6:
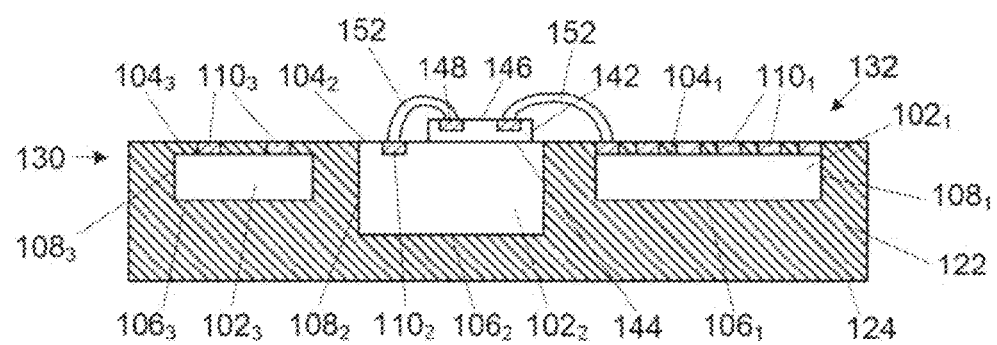
FIG. 6 illustrates the electrical attachment of the active surface microelectronic device by bond wires to at least one of the microelectronic device of the encapsulated structure, according to an embodiment of the present description.
Figure 7:
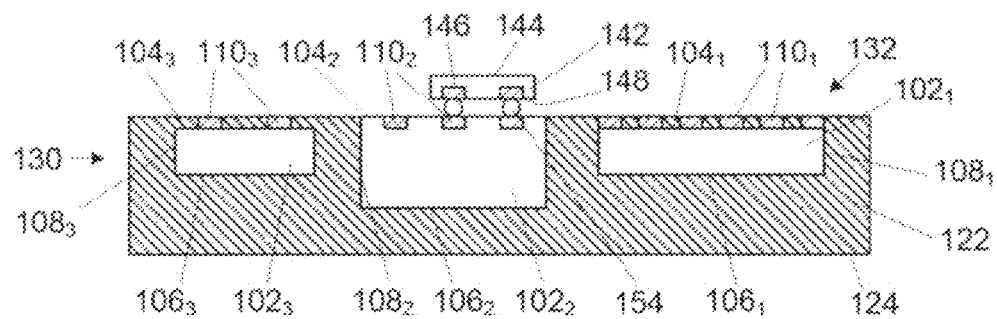
FIG. 7 illustrates the electrical attachment of the active surface microelectronic device by solder balls to at least one of the microelectronic device of the encapsulated structure, according to an embodiment of the present description.
Figure 8:
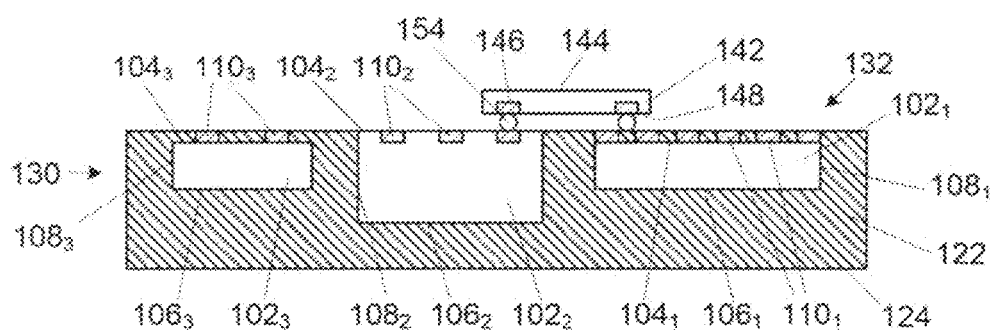
FIG. 8 illustrates the electrical attachment of the active surface microelectronic device by solder balls to at least one of the microelectronic device of the encapsulated structure, according to an embodiment of the present description.

Once the encapsulation material 122 has cured, or otherwise substantially solidified, it may be removed from the carrier substrate 112 to form an encapsulated structure 130 having an active surface 132 formed from a portion of the encapsulation material 122 which abutted the carrier substrate 112 and the active surfaces $104_1$-$104_3$ and/or the connection structures $110_1$-$110_3$ of each microelectronic device $102_1$-$102_3$, as shown in FIG. 4, wherein the portion of the encapsulation material 122 which abutted the carrier substrate 112 may be substantially planar to and the active surfaces $104_1$-$104_3$ and/or the connection structures $110_1$-$110_3$ of each microelectronic device $102_1$-$102_3$. As shown in FIGS. 5-7, at least one active surface microelectronic device 142 may be placed proximate the encapsulated structure active surface 132. The active surface microelectronic device(s) 142 may be any appropriate device such as an active device, including but not limit to a microprocessor, a chipset, a controller, a graphics device, a wireless device, a memory device, and an application specific integrated circuit, or a passive device, including but not limited to a resistor, a capacitor, and an inductor. Although the active surface microelectronic device 142 is illustrated in FIGS. 5-13 as adjacent the microelectronic device $102_2$, it may be adjacent any microelectronic device $102_1$-$102_3$, adjacent the encapsulation material 122, or both.

As shown in FIG. 5, the at least one active surface microelectronic device 142 may be placed with a back surface 144 thereof contacting the encapsulated structure active surface 132 such that electrical contact may be made with at least one of the microelectronic devices $102_1$-$102_3$ in a subsequently formed build-up layer. In other embodiment, the at least one active surface microelectronic device 142 may be placed with the back surface 144 thereof contacting the encapsulated structure active surface 132 with at least one bond wire 152 extending from at least one connection structure 148 on an active surface 146 of the active surface microelectronic device 142 and at least one of the connection structures 110₁-110₃ of at least one microelectronic device 102₁-102₃, as shown in FIG. 6. Furthermore, in another embodiment as shown in FIG. 7, the active surface microelectronic device 142 may be directly, electrically attached to at least one of the microelectronic device 102₁-102₃ through a plurality of interconnects 154, such as solder balls extending between at least on active surface microelectronic device connection structure 148 and at least one microelectronic device connection structure 110₁-110₃ (shown as microelectronic device connection structures 110₂). In one example of the embodiment of FIG. 7, the microelectronic device 102₂ may be a microprocessor and the active surface microelectronic device 142 may be a memory device. It is understood that as the at least one active surface microelectronic device 142 is either placed in contact with the encapsulated structure active surface 132 or electrically attached to microelectronic devices 102₁-102₃ within the encapsulated structure 130 after the formation of the encapsulated structure 130, the at least one active surface microelectronic device 142 is not encapsulated within the encapsulation material 122 of encapsulate structure 130.

Figure 9:
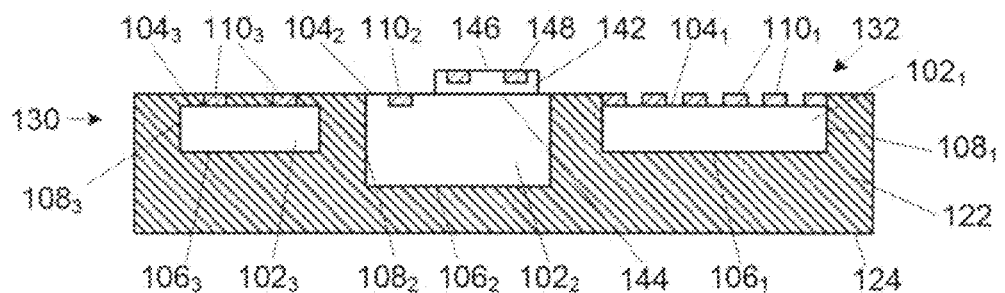
FIG. 9 illustrates the encapsulated structure of the present description wherein the encapsulation material does not surround projecting interconnects of at least microelectronic device or has been removed, according to an embodiment of the present description.

Referring back to FIGS. 2 and 3, the encapsulation material 122 may be sufficiently viscous to surround any projecting interconnections extending from the microelectronic devices, such as the microelectronic interconnects 110₁ and 110₃. As shown in FIG. 9, the encapsulation material 122 may not be sufficiently viscous to surround projecting interconnections, such as the microelectronic device interconnects 110₁. Further, it is understood that if the encapsulation material 122 is not desired to surround projecting interconnections, it may be removed by any technique known in the art.

Figure 10:
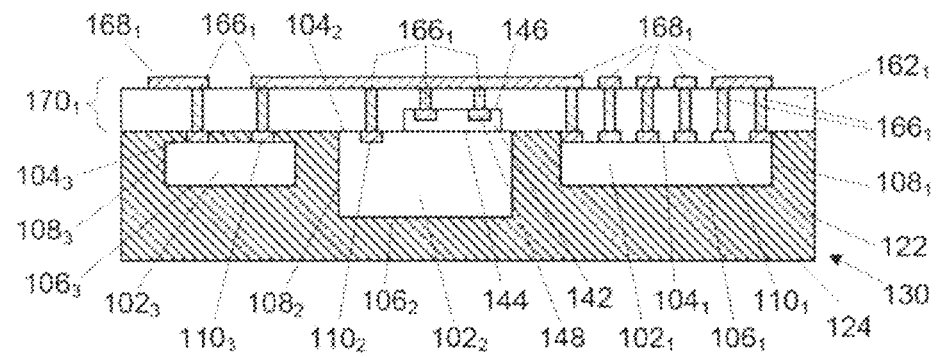
FIG. 10 illustrates the structure of FIG. 9 with a dielectric material layer disposed over the encapsulated structure and the active surface microelectronic device, if present, according to an embodiment of the present description.

As shown in FIG. 10, a first dielectric material layer 162₁ may be disposed adjacent the encapsulated structure active surface 132 and the active surface microelectronic device 142 (if present). The first dielectric material layer 162₁ may be formed by any technique known in the art including deposition, such as spraying, followed by planarization, by self-planarizing screen printing, or the like. The dielectric layers may be any appropriate dielectric material, including but not limited to, silicon dioxide ($SiO_2$), silicon oxynitride ($SiO_xN_y$), and silicon nitride ($Si_3N_4$) and silicon carbide (SIC), as well as silica-filled epoxies, and the like, as previously discussed.

Figure 11:
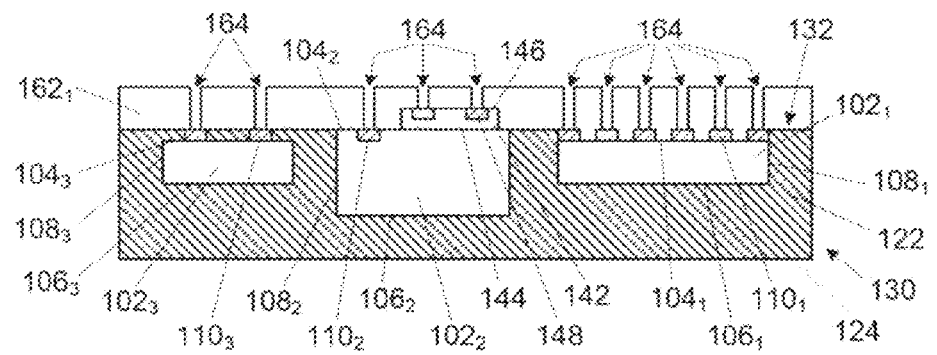
FIG. 11 illustrates the structure of FIG. 10 with openings formed through the dielectric material layer to expose as least one interconnect of at least one microelectronic device and at least one active surface microelectronic device, if present, according to an embodiment of the present description.

As shown in FIG. 11, openings 164 may be formed through the first dielectric material layer 162₁ to expose at least a portion of each microelectronic device connection structure 110₁-110₃ and at least one of the active surface microelectronic device interconnections 148 (if present). The openings 164 maybe be formed by any technique known in the art including but not limited to laser drilling, ion drilling, photolithography/etching, and the like.

Figure 12:
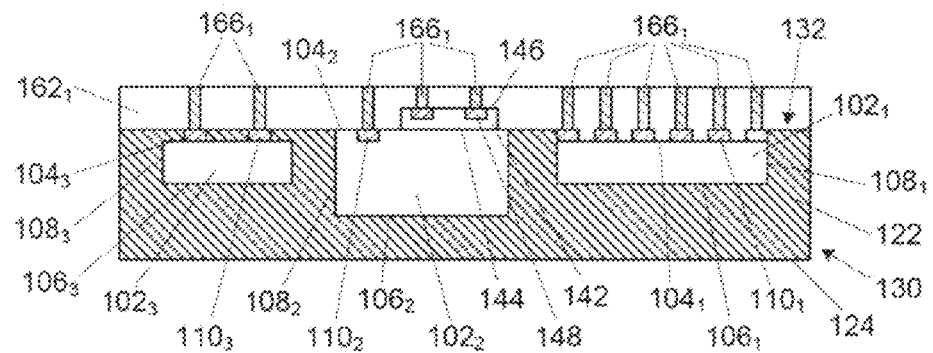
FIG. 12 illustrates the structure of FIG. 11 wherein the openings are filled with a conductive material to form conductive vias, according to an embodiment of the present description.

As shown in FIG. 12, the openings 164 may be fill with a conductive material to form first conductive vias 166₁. The conductive material may be any appropriate material, including but not limited to, copper, aluminum, silver, gold, alloys thereof, and the like. The conductive material may be disposed by any technique known in the art, including but not limited to deposition, plating, or the like, which may be followed by planarization, as will be understood to those skilled in the art.

Figure 13:
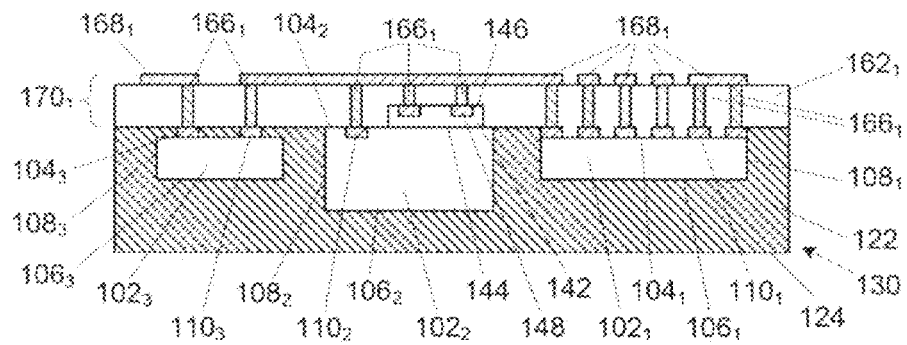
FIG. 13 illustrates the structure of FIG. 12 wherein conductive traces are formed on the dielectric material layer, according to an embodiment of the present description.

As shown in FIG. 13, a plurality of first conductive traces 168₁ may be patterned on the first dielectric material layer 162₁ to contact at least one of the first conductive vias 166₁. The first conductive traces 168₁ may be patterned by any techniques know in the art including but not limited to deposition or plating followed by lithography/etching. The first conductive traces 168₁ may be formed from any appropriate conductive material, as previously discussed, and by any techniques known in the art, including lithography, disposition, plating, and the like. The first dielectric material layer 162₁, the first conductive vias 166₁, and the first conductive traces 168₁ may form a first build-up layer 170₁.

Figure 14:
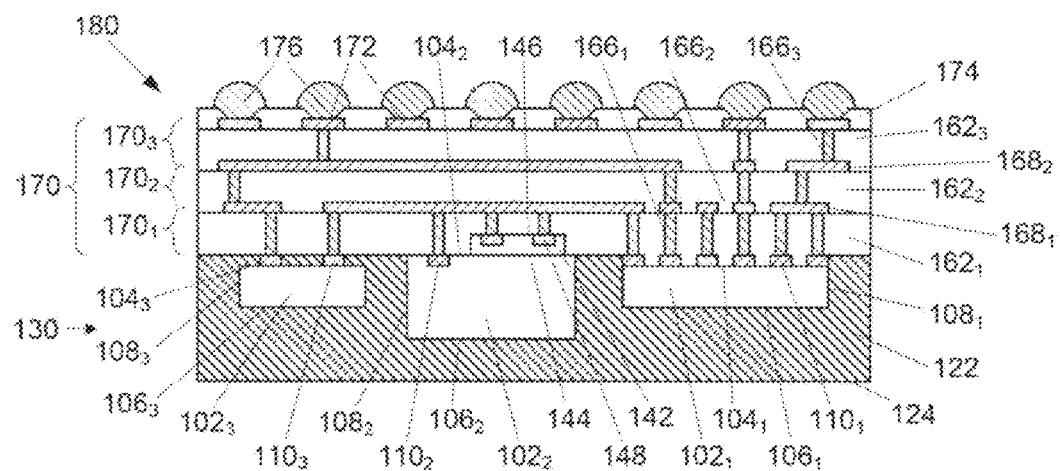
FIG. 14 illustrates a microelectronic package, according to an embodiment of the present description.

The process for forming the first build-up layer 170₁ as shown in FIG. 13 may be repeated until a desired conductive routing is formed. As shown in FIG. 14, a second build-up layer 170₂ may be formed comprising a second dielectric material layer 162₂, second conductive vias 166₂, and second conductive traces 168₂. As further shown in FIG. 14, a final build-up layer 170₃ may be formed comprising a third dielectric material layer 162₃, third conductive vias 166₃, and bond pads 172. The combination of the build-up layers (e.g. the first build-up layer 170₁, the second build-up layer 170₂, and the final build-up layer 170₃) may form a bumpless build-up layer structure 170.

As further shown in FIG. 13, a solder resist material 174 may be formed on the bumpless build-layer structure 170 with at least a portion of each of the bond pads 172 is exposed there through. External interconnects 176 may be formed on each of the bond pads 172, such as with the illustrated ball grid array interconnects, to form a microelectronic package 180. The solder resist material 174 may be utilized to contain the solder material used to form solder-containing external interconnects 176, as will be understood to those skilled in the art. The external interconnects 176 may be used to attach the microelectronic package 180 to other microelectronic structures (not shown), such as motherboards, printed circuit boards, and the like. Although the external interconnects 176 are illustrated as ball grid array interconnects, it is understood that the external interconnects 176 may be any appropriate external interconnect, including but not limited to solder grid arrays, pin grid arrays, land grid arrays, and the like, as will be understood to those skilled in the art. When solder is used to form the external interconnects 176, such as ball grid arrays and solder grid arrays, the solder may be any appropriate material, including, but not limited to, lead/tin alloys and high tin content alloys (e.g. about 90% or more tin), and similar alloys.

Figure 15:
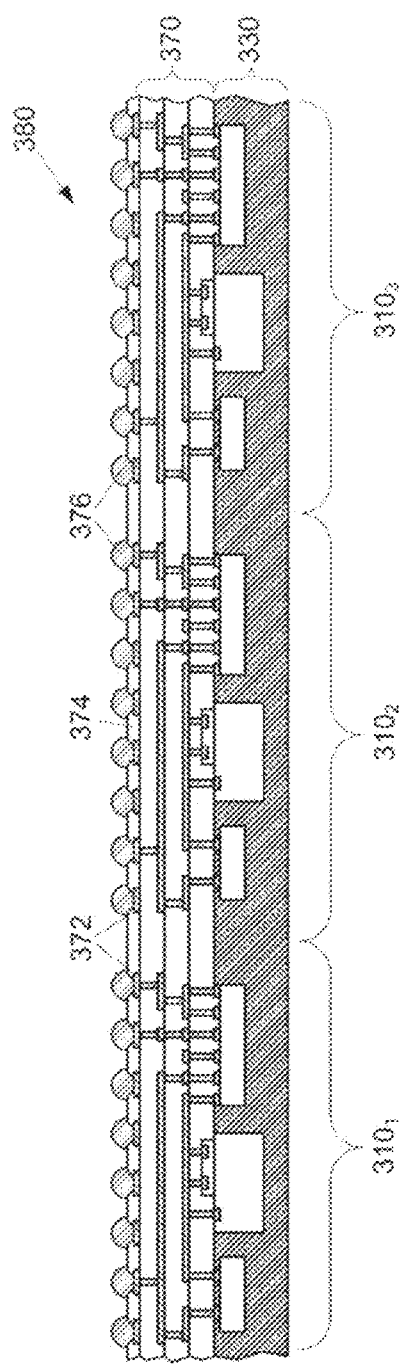
FIG. 15 illustrates multiple sets of microelectronic devices for the simultaneous fabrication of multiple microelectronic packages, according to one implementation of the present description.

Although FIGS. 1-14 illustrate the formation of a single microelectronic package 180, it is understood that a plurality of packages may be form simultaneously. As shown in FIG. 15, multiple sets 310₁-310₃ of the microelectronic devices 102₁-102₃ (see FIGS. 1-14) may be placed on a substrate carrier 112 (see FIGS. 1-3) and simultaneously encapsulated with the encapsulation material 122 (see FIGS. 2-14), as previously discussed, to form a multiple encapsulated structure 330. A multiple bumpless build-up layer structure 370 may be formed on the multiple encapsulated structure 330 in a manner previously described with regard to the bumpless build-up layer structure 170 (see FIGS. 9-14). A multiple solder resist layer 372 and multiple package external interconnects 374 may be formed in a manner previously described with regard to the solder resist layer 172 and the external interconnects 174 (see FIG. 114) to form a multiple package structure 380.

Figure 16:
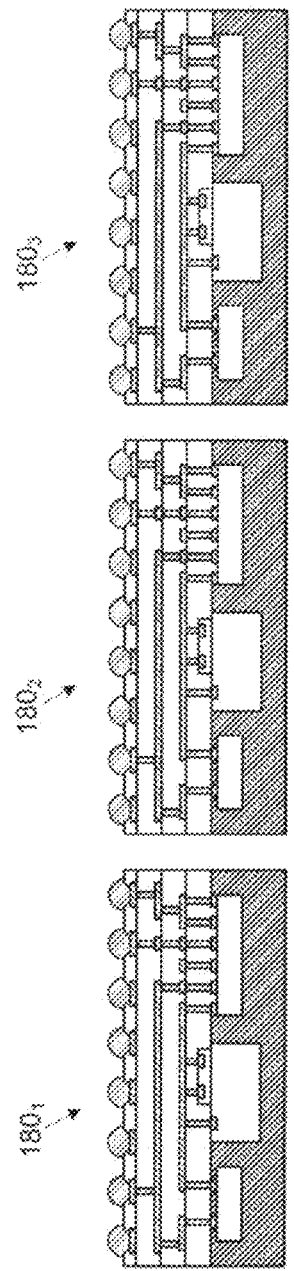
FIG. 16 illustrates the structure of FIG. 15 wherein the multiple sets microelectronic devices are singulated or diced to form individual microelectronic packages, according to one implementation of the present description.

As shown in FIG. 16, the multiple package structure 380 of FIG. 15 may be diced or cut to separate each microelectronic device sets 310₁-310₃ into individual microelectronic packages 180₁-180₃. The dicing may be performed by any technique known in the art including, but not limited to, sawing, laser cutting, ion bombardment, and the like.

Figure 19:
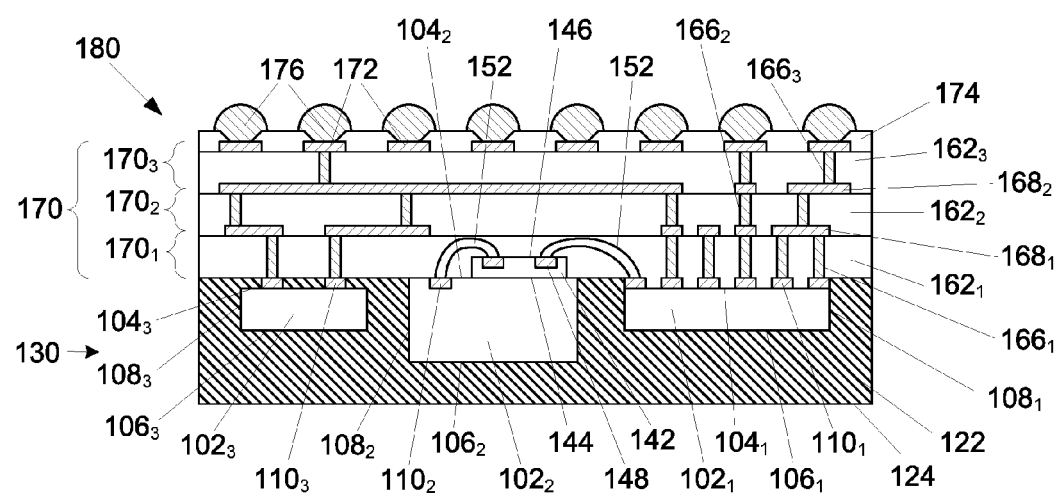
FIG. 19 illustrates a microelectronic package, according to another embodiment of the present description.

As shown in FIG. 19, the package 180 of FIG. 14 may include at least one bond wire 152 extending from at least one connection structure 148 on an active surface 146 for the microelectronic device 142 and at least one of the connection structures $110_1$-$110_3$ of at least one microelectronic device $102_1$-$102_3$.

Figure 17:
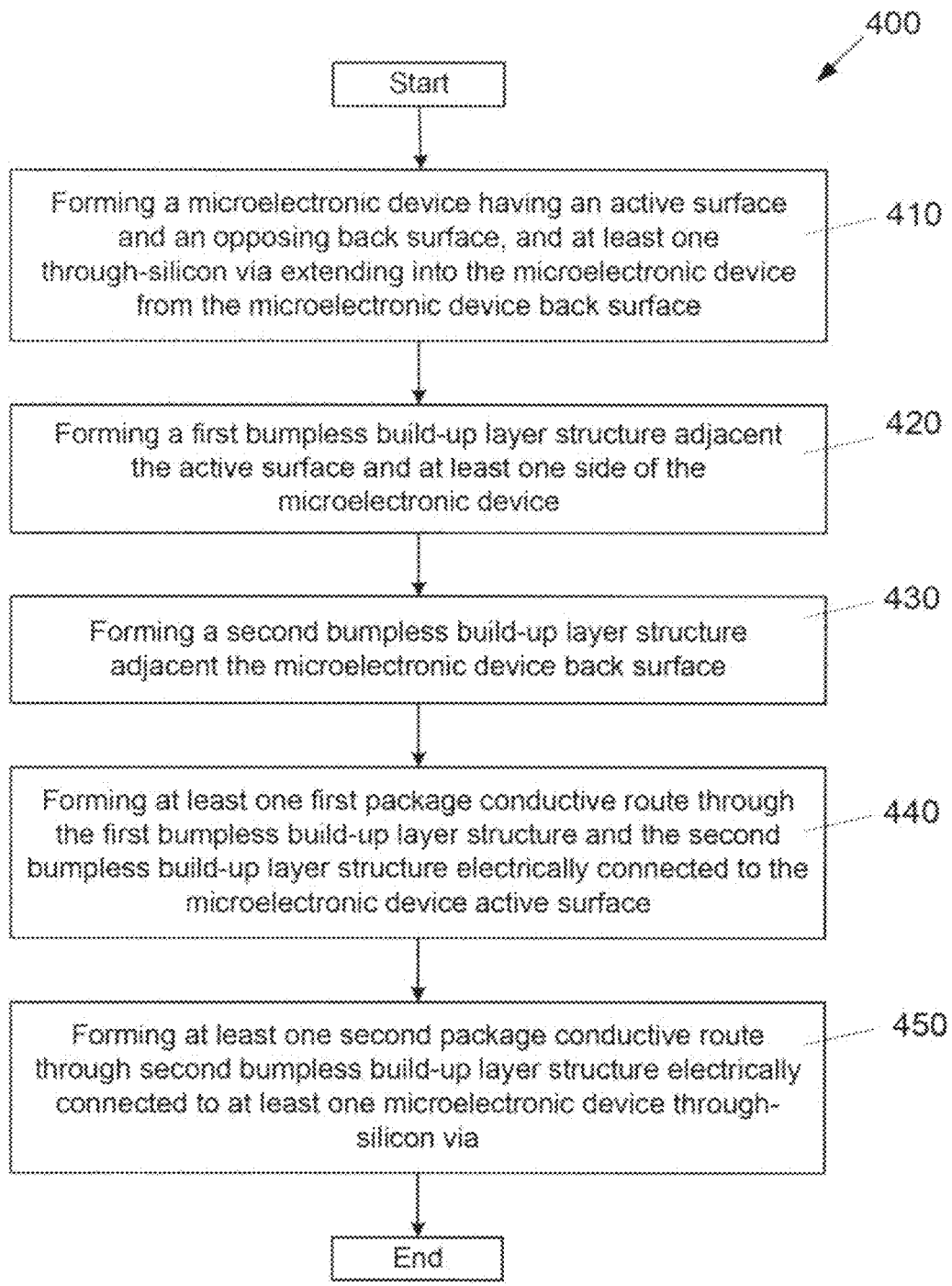
FIG. 17 illustrates a flow diagram of a process for fabrication a microelectronic structure, according to an embodiment of the present description.

An embodiment of one process of fabricating a microelectronic structure of the present description is illustrated in a flow diagram 400 of FIG. 17. As defined in block 410, a plurality of microelectronic devices may be position on a substrate carrier, wherein the active surface of each of the microelectronic devices faces the substrate carrier and wherein at least one of the plurality of microelectronic devices has a height greater than another of the plurality of microelectronic devices. As defined in block 420, the plurality of microelectronic devices may be encapsulated with an encapsulation material. The encapsulation material layer then be cured to form an encapsulated structure having an active surface abutting the carrier substrate, as defined in block 430. As shown in block 440, the encapsulated structure may be removed from the carrier substrate. As shown in block 450, an active surface microelectronic structure may be positioned on the encapsulated structure active surface. The active surface microelectronic device may be electrically connected to at least one of the plurality of microelectronic devices within the encapsulated structure, as shown in block 460. As shown in block 470, a bumpless bump-up layer structure may be formed on the encapsulated structure active surface and the active surface microelectronic device.

Figure 18:
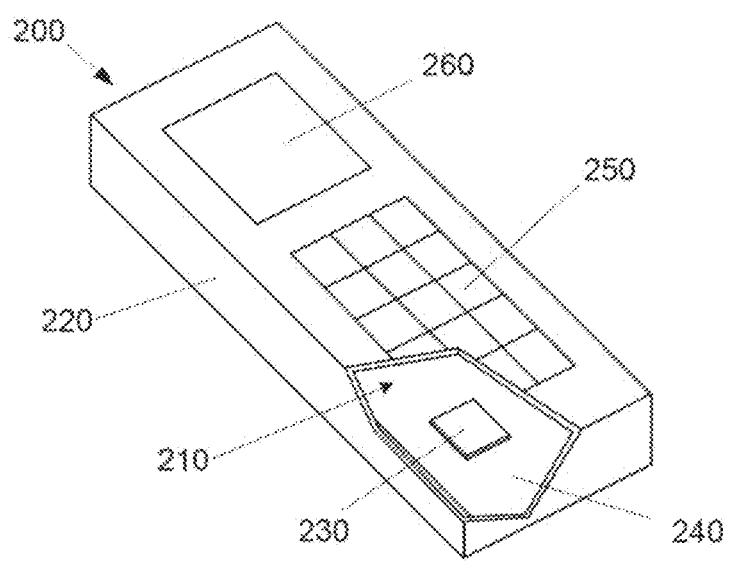
FIG. 18 illustrates an electronic system/device, according to one implementation of the present description.

FIG. 18 illustrates an embodiment of an electronic system/device 500, such as a portable computer, a desktop computer, a mobile telephone, a digital camera, a digital music player, a web tablet/pad device, a personal digital assistant, a pager, an instant messaging device, or other devices. The electronic system/device 200 may be adapted to transmit and/or receive information wirelessly, such as through a wireless local area network (WLAN) system, a wireless personal area network (WPAN) system, and/or a cellular network. The electronic system/device 500 may include a microelectronic substrate 510 (such as a motherboard, a printed circuit, or the like) within a housing 520. As with the embodiments of the present application, a microelectronic package 530 (see element 180 of FIG. 14 and elements $180_1$-$180_3$ of FIG. 16) attached thereto. As previous described, the microelectronic package 530 may include a plurality of encapsulated microelectronic devices $102_1$-$102_3$ (see FIG. 1-14) forming an encapsulated structure 130 (see FIGS. 4-14), wherein the microelectronic devices may have differing heights, and an optional active surface microelectronic device 142 (see FIGS. 5-14) on the encapsulated structure active surface (see FIGS. 4-14), and wherein a bumpless build-up structure 170 (see FIG. 14) may be formed on the encapsulated structure 130. The microelectronic substrate 510 may be attached to various peripheral devices including an input device 540, such as keypad, and a display device 550, such an LCD display. It is understood that the display device 550 may also function as the input device, if the display device 550 is touch sensitive.

It is understood that the subject matter of the present description is not necessarily limited to specific applications illustrated in FIGS. 1-18. The subject matter may be applied to other microelectronic device fabrication applications, as will be understood to those skilled in the art.

Having thus described in detail embodiments of the present invention, it is understood that the invention defined by the appended claims is not to be limited by particular details set forth in the above description, as many apparent variations thereof are possible without departing, from the spirit or scope thereof.

What is claimed is:

1. A microelectronic package, comprising:
an encapsulated structure including a plurality of microelectronic devices having active surfaces substantially encapsulated within an encapsulation material, wherein the encapsulated structure includes an active surface proximate the microelectronic device active surfaces, and wherein at least one of the plurality of microelectronic devices has a height greater than another of the plurality of microelectronic devices;
at least one microelectronic device that is not encapsulated within the encapsulation material positioned proximate the encapsulated structure active surface and electrically connected to at least one of the plurality of microelectronic devices of the encapsulated structure through at least one bond wire; and
a bumpless build-up layer structure formed on the encapsulated structure active surface, wherein a first dielectric layer of the bumpless build-up layer structure substantially encapsulates the at least one microelectronic device that is not encapsulated within the encapsulation material.

2. The microelectronic package of claim 1, wherein the at least one microelectronic device that is not encapsulated within the encapsulation material is electrically connected to at least one of the plurality of microelectronic devices of the encapsulated structure through the bumpless build-up layer structure.

3. The microelectronic package of claim 1, further comprising external interconnects electrically connected to the bumpless build-up layer structure.

4. The microelectronic package of claim 1, wherein at least one of the plurality of microelectronic devices of the encapsulated structure includes at least one connection structure extending from the active surface thereof, and wherein the encapsulation material does not encapsulate the at least one connection structure of the at least one of the plurality of microelectronic devices of the encapsulated structure.

5. The microelectronic package of claim 1, wherein the encapsulation material comprises a silica-filled epoxy.

6. A microelectronic package, comprising:
an encapsulated structure including a plurality of microelectronic devices having active surfaces substantially encapsulated within an encapsulation material, wherein the encapsulated structure includes an active surface proximate the microelectronic device active surfaces, wherein at least one of the plurality of microelectronic devices has a height greater than another of the plurality of microelectronic devices, wherein the encapsulated structure further comprises a back surface, wherein the encapsulated structure back surface is substantially co-planar with a back surface of at least one of the plurality of microelectronic devices of the encapsulated structure having the greatest height;
at least one microelectronic device that is not encapsulated within the encapsulation material positioned proximate the encapsulated structure active surface; and
a bumpless build-up layer structure formed on the encapsulated structure active surface, wherein a first dielectric layer of the bumpless build-up layer structure substantially encapsulates the at least one microelectronic device that is not encapsulated within the encapsulation material and wherein the at least one microelectronic device that is not encapsulated is electrically connected to at least one of the plurality of microelectronic devices of the encapsulated structure through at least one bond wire.

7. The microelectronic package of claim 6, wherein the encapsulation material comprises a silica-filled epoxy.

* * * * *